United States Patent
Li et al.

(10) Patent No.: US 10,643,862 B2
(45) Date of Patent: May 5, 2020

(54) SYSTEM-LEVEL PACKAGING METHOD AND PACKAGING SYSTEM BASED ON 3D PRINTING

(71) Applicant: INSTITUTE OF GEOLOGY AND GEOPHYSICS CHINESE ACADEMY OF SCIENCES, Beijing (CN)

(72) Inventors: Zongwei Li, Beijing (CN); Xingyin Xiong, Beijing (CN); Kedu Han, Beijing (CN); Changchun Yang, Beijing (CN)

(73) Assignee: INSTITUTE OF GEOLOGY AND GEOPHYSICS CHINESE ACADEMY OF SCIENCES, Beijing (CN)

( * ) Notice: Subject to any disclaimer, the term of this patent is extended or adjusted under 35 U.S.C. 154(b) by 30 days.

(21) Appl. No.: 15/962,807

(22) Filed: Apr. 25, 2018

(65) Prior Publication Data
US 2019/0228986 A1 Jul. 25, 2019

(30) Foreign Application Priority Data
Jan. 24, 2018 (CN) .......................... 2018 1 0070196

(51) Int. Cl.
*H01L 21/48* (2006.01)
*H01L 21/67* (2006.01)
(Continued)

(52) U.S. Cl.
CPC ...... *H01L 21/4857* (2013.01); *H01L 21/4867* (2013.01); *H01L 21/52* (2013.01);
(Continued)

(58) Field of Classification Search
None
See application file for complete search history.

(56) References Cited

U.S. PATENT DOCUMENTS
2014/0252584 A1 9/2014 Spory

FOREIGN PATENT DOCUMENTS
CN 103327741 A 9/2013
CN 206353525 U 7/2017

*Primary Examiner* — Abul Kalam
(74) *Attorney, Agent, or Firm* — Platinum Intellectual Property LLP

(57) ABSTRACT

The present invention discloses a system-level packaging method and packaging system based on 3D printing. The packaging method includes the following steps: providing a carrier; printing a first packaging substrate on the surface of the carrier by using a 3D printing method, wherein metal wires are disposed on the first packaging substrate; fixing a first component to the first packaging substrate, and electrically connecting the first component to the first packaging substrate; continuing to print a second packaging substrate on the surface of the first packaging substrate by using the 3D printing method, wherein metal wires are disposed on the second packaging substrate, and the second packaging substrate has an electrical connection with the first packaging substrate; fixing a second component to the second packaging substrate, and electrically connecting the second component to the second packaging substrate; repeating the above steps to form a multilayer system-level packaging structure in which all components are embedded; and printing a packaging cover plate by using the 3D printing method. The packaging method has the advantages of simple process, low cost, less pollution, high efficiency and high reliability, and meets the requirements of system-level packaging.

4 Claims, 1 Drawing Sheet

(51) Int. Cl.
*H01L 23/538* (2006.01)
*H01L 21/52* (2006.01)
*H01L 21/683* (2006.01)

(52) U.S. Cl.
CPC .... *H01L 21/67144* (2013.01); *H01L 21/6835* (2013.01); *H01L 23/5389* (2013.01); *H01L 2221/68345* (2013.01); *H01L 2221/68359* (2013.01)

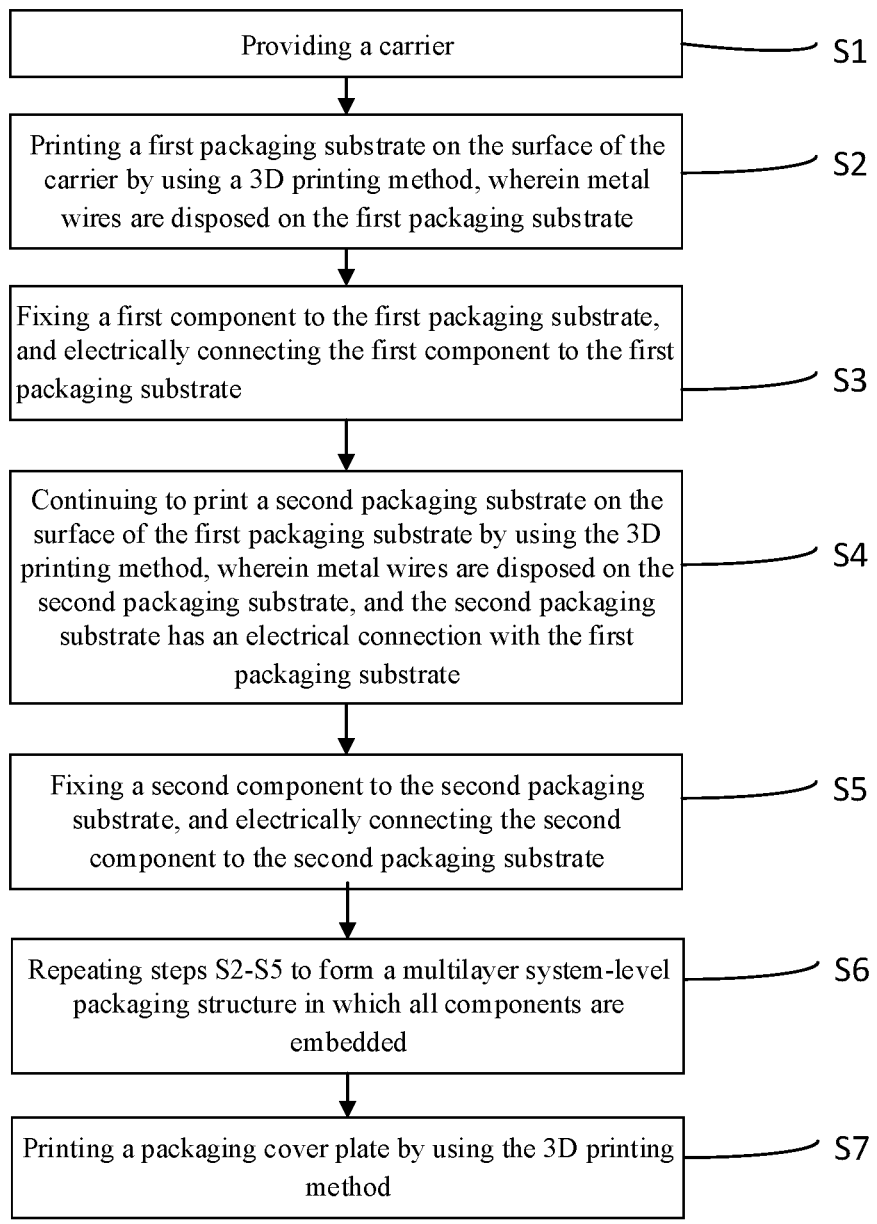

SYSTEM-LEVEL PACKAGING METHOD AND PACKAGING SYSTEM BASED ON 3D PRINTING

RELATED APPLICATIONS

This application is a United States National Stage Application filed under 35 U.S.C. 371 of PCT Patent Application Serial No. PCT/CN2017/080784, filed Apr. 17, 2017, which claims Chinese Patent Application Serial No. CN 201610321306.6, filed May 16, 2016, the disclosure of all of which are hereby incorporated by reference in their entirety.

FIELD OF THE INVENTION

The present invention relates to the technical field of semiconductor packaging, and in particular to a system-level packaging method and packaging system based on 3D printing.

BACKGROUND OF THE INVENTION

The main function of packaging is to wrap components in a package, this not only plays a role in mounting, fixing, sealing, protecting a chip and enhancing the electrical and thermal properties, but also connects the contacts on the chip to the pins of the package through wires, and these pins are connected with other devices through wires disposed on a circuit board so as to realize the connections between an internal chip and an external circuit. The chip must be isolated from the outside in order to prevent the chip circuit from being corroded by impurities in the air and water vapor to cause reduction of the electrical performance. In addition, the packaged chip is also more convenient to install and transport. The packaging technology has a direct impact on the performance of the chip itself, as well as the design and the manufacture of the circuit board connected, so the packaging is crucial.

Due to the ever-increasing requirements of whole electronic equipment and systems for high-density assembly such as miniaturization, light weight and thinning in the fields such as aviation, aerospace and computers, electronic assembly will develop towards the three-dimensional assembly on the basis of the two-dimensional assembly for a limited area and gradually develop to the system-level packaging.

However, the traditional packaging technology has high complexity process and low precision, and requires to design and manufacture different packages for different chips, which involves the production of the mold, the complex entire manufacturing process, time-consuming and costly. Thereby it seriously restricts the progress of research and development.

SUMMARY OF THE INVENTION

Based on this, it is necessary to provide a packaging method and a packaging system with high production efficiency and good packaging performance.

A system-level packaging method based on 3D printing includes the following steps:

providing a carrier; printing a first packaging substrate on the surface of the carrier by using a 3D printing method, wherein metal wires are disposed on the first packaging substrate; fixing a first component to the first packaging substrate, and electrically connecting the first component to the first packaging substrate; continuing to print a second packaging substrate on the surface of the first packaging substrate by using the 3D printing method, wherein metal wires are disposed on the second packaging substrate, and the second packaging substrate has an electrical connection with the first packaging substrate; fixing a second component to the second packaging substrate, and electrically connecting the second component to the second packaging substrate; repeating the above steps to form a multilayer system-level packaging structure in which all components are embedded; and printing a packaging cover plate by using the 3D printing method.

In one of the embodiments, the preparation method of the metal wires includes the following steps:

spraying metal powder on the surface of the substrate according to a preset path by using a spray head, and synchronously emitting laser via a laser to melt the metal powder to obtain the metal wires after curing forming.

In one of the embodiments, the laser is an Nd-YAG laser, a CO2 laser or a fiber laser.

In one of the embodiments, before the printing each layer of the packaging substrate, the method further includes the following steps: scanning the to-be-packaged component corresponding to the present packaging substrate layer; and generating a 3D printing design drawing corresponding to the present packaging substrate layer.

In one of the embodiments, the surface of the packaging substrate is provided with a groove matching with the corresponding component, and the corresponding component is embedded in the groove.

In one of the embodiments, materials of the packaging substrate and the packaging cover plate include at least one of plastic, ceramic, glass and metal.

In one of the embodiments, the carrier is one of a glass carrier board, a silicon carrier board, a metal carrier board, a plastic carrier board and a ceramic carrier board.

In one of the embodiments, the packaging method can be applied to package an ASIC chip, a FPGA chip, a MEMS chip, a Flash chip or a PowerPC processor chip, or a functional module or system consisting of the above chips.

The present invention further provides a packaging system based on 3D printing, wherein the packaging system includes: a pick-and-place unit used for picking and placing a component; an input unit used for inputting a design drawing; a printing unit used for printing to generate a packaging substrate and a packaging cover plate; a SMD unit used for fixing the component to the packaging substrate; and a bonding unit used for accomplishing the electrical connection between the packaging substrate and the corresponding component.

In one of the embodiments, the packaging system further includes a scanning unit used for scanning the component to generate the design drawing of the corresponding packaging substrate layer.

The chip packaging method of the present invention adopts the 3D printing method to replace the photolithography and etching steps of through via, and to replace the photolithography, etching and electroplating deposition and other process steps of the metal wires, thereby greatly reducing complexity of the process and pollutant emissions, significantly reducing the processing cost, effectively improving the processing efficiency, and being able to reduce the design and processing costs, shorten the research and development time and improve the processing accuracy and reliability. In addition, in the chip packaging method of the present invention, after the carrier and the packaging layer are removed, no redundant packaging layer is left on the back of the chip, so that the packaged chip is thinner and lighter, and the requirements of device miniaturization are satisfied.

As the present application adopts the system-level packaging method based on 3D printing, the substrate and the packaging layer with complex three-dimensional structures can be manufactured to adapt to the development of three-dimensional packaging.

The present system-level packaging method based on 3D printing has prominent advantages in single-piece and small-batch production. Moreover, compared with the expensive high-precision equipment in the traditional packaging manufacturing technology, the industrial-grade 3D printer is low in cost, which in turn allows large-scale production and is beneficial to the large-scale and low-cost industrial production of packaging.

Therefore, the system-level packaging method based on 3D printing of the present invention has high packaging accuracy, high production efficiency, and good product packaging performance.

BRIEF DESCRIPTION OF THE DRAWINGS

FIG. 1 is a flowchart of a system-level packaging method based on 3D printing in an embodiment.

DETAILED DESCRIPTION OF THE EMBODIMENTS

To facilitate the understanding of the present invention, the present invention will be described more fully hereinafter with reference to the drawings. The preferred embodiments of the invention are given in the drawings. However, the present invention may be implemented in many different forms and are not limited to the embodiments described herein. On the contrary, these embodiments are provided so that the contents disclosed by the present invention may be understood more thoroughly and completely.

It should be noted that when an element is referred to as being "fixed" to another element, it may be directly on the other element or there may also be an intermediate element. When an element is considered as being "connected" to another element, it can be directly connected to the other element or there may be an intermediate element at the same time.

Unless otherwise defined, all technical and scientific terms used herein have the same meanings as commonly understood by those skilled in the art to which the present invention belongs. The terms used in the description of the present invention herein are for the purpose of describing specific embodiments only and are not intended to limit the present invention. As used herein, the term "and/or" includes any of one or more of the associated listed items and a combination of all of them.

In the embodiment shown in FIG. 1, the system-level packaging method based on 3D printing includes the following steps:

S1: provide a carrier.

The role of the carrier is to provide a rigid structure or substrate for the packaging substrate layer. Optionally, the carrier includes one of a glass carrier board, a silicon carrier board, a metal carrier board, a plastic carrier board and a ceramic carrier board. Preferably, the carrier is made of ceramic, and using ceramic as the carrier has the following advantages: firstly, the ceramic has greater rigidity and is unlikely to deform; secondly, the ceramic has high thermal conductivity and is applicable to a high temperature environment; and thirdly, the coefficient of thermal expansion of the ceramic is closer to that of the electronic components, when the whole system is applied to high or low temperature environment, the thermal stress is smaller, and the system performance is more stable. The carrier may have a circular shape or other shape, and its shape is not limited, but the area should not be smaller than the bottom area of the first packaging substrate. The thickness of the carrier should guarantee that the carrier has sufficient rigidity and is not easily deformed. The roughness of the upper surface of the carrier should be less than 50 micrometers. Preferably, the roughness of the upper surface of the carrier should be less than 10 micrometers, so that the packaging substrate formed on the carrier can have sufficient accuracy.

S2: print a first packaging substrate on the surface of the carrier by using a 3D printing method, wherein metal wires are disposed on the first packaging substrate.

In one embodiment, the drawing for printing the first packaging substrate by using the 3D printing method is manually generated and inputted, and the drawing includes, but not limited to, the shape and the thickness of the packaging substrate, and the layout of the metal wires. In one embodiment, before step S2, the method further includes: scanning the to-be-packaged component corresponding to the present packaging substrate layer; and automatically generating a 3D printing design drawing corresponding to the present packaging substrate layer.

In one embodiment, a groove is disposed on the surface of the first packaging substrate matching with the first component, and the first component is embedded in the groove.

The material of the packaging substrate is plastic, ceramic, glass or metal. The plastic material includes polyamide fiber (PA), polystyrene (PS), thermoplastic elastomer (TPE), polyaryletherketone (PAEK), and the like; the ceramic material includes aluminum oxide, aluminum nitride, high-temperature co-fired ceramic, low-temperature co-fired ceramic or the like; and the metal material includes chisel tool steel, high-grade steel, aluminum, cobalt-chromium alloy, nickel alloy, titanium, and the like.

In one embodiment, the material of the packaged chip is silicon. Since the silicon has a lower coefficient of thermal expansion, the material of the packaging substrate is ceramic in order to reduce the packaging thermal stress. Further, when the packaging system is applied to a high temperature environment, the material of the packaging substrate is aluminum nitride, because the aluminum nitride has higher thermal conductivity, it is easier to transfer the heat generated inside the package to the outside. In one embodiment, the packaged chip has lower environmental requirements. In order to reduce the packaging cost, the material of the packaging substrate is plastic. In one embodiment, the packaged chip is an optical chip, and the material of the packaging substrate is glass.

In one embodiment, the process of printing the packaging substrate is as follows: spreading a layer of powder; spraying an adhesive on the area to be formed, and bonding the material powder to form a section of the part; and repeating the above steps, and isopressing the layers to form the packaging substrate. The packaging process is applicable when the substrate material is ceramic, glass or metal.

In one embodiment, the process of printing the packaging substrate is as follows: spraying a layer of powder material, preheating the material to a temperature approximate to the melting point, performing laser scanning and sintering, and repeating the powder spreading, and the laser scanning and sintering steps. The packaging process is applicable when the substrate material is metal.

In one embodiment, the process of printing the packaging substrate is as follows: heating a wire material to a temperature slightly higher than the melting temperature (about 1° C. higher than the melting point) by using an electrical heating method, moving a spray head in an x-y plane under the control of a computer to coat the molten material on a workbench so as to form a layer of section of a workpiece after the molten material cools down, after one layer is formed, moving the spray head upward by the height of a layer to coat the next layer, and stacking the molten material layer by layer to form a three-dimensional packaging substrate. The packaging process is applicable when the substrate material is plastic.

In one embodiment, the process of printing the packaging substrate is as follows: spraying a layer of substrate material, performing laser scanning on liquid photosensitive resin to generate photo-polymerization reaction for curing, repeating the spaying and the laser scanning curing steps again and again, and superposing the substrate material layer by layer to form a three-dimensional packaging substrate. Preferably, the laser scanning process is performed by a high-resolution digital optical processing projector, which increases the manufacturing accuracy. The packaging process is applicable when the substrate material is plastic.

Those skilled in the art can select matched 3D printing technology according to the materials used in the packaging process to obtain better packaging performance.

In one embodiment, the preparation method of the metal wires includes the following steps: spraying metal powder on the surface of the substrate according to a preset path by using the spray head, and synchronously emitting laser via a laser to melt the metal powder to obtain the metal wires after curing forming. The laser is an Nd-YAG laser, a CO2 laser or a fiber laser.

In one embodiment, the metal wires are printed by laser engineered net shaping technology. The laser engineered net shaping technology (LENS) combines the selective laser sintering (SLS) technology with the laser cladding technology to quickly obtain metal structures with high density and strength. The laser engineered net shaping system consists of four parts: a computer, a high-power laser, a metal powder spray head and a workbench. The computer is used for establishing a solid model of the metal wires in the preparatory stage of metal wires shaping, converting the solid model into an STL file, and slicing the STL file of the part to generate a series of thin layers with certain thicknesses and a scanning trajectory of each thin layer; the computer is further used for performing ordered control under the same instruction on components (including, but not limited to, a laser shutter, a correction light switch, a protective gas valve, a spray head motor and a workbench motor or the like) so as to accomplish the processing of the metal wires. In the laser engineered net shaping system, the laser directly melts the metal powder to achieve the cladding, thus requiring high-power laser.

Specifically, the laser may use an Nd-YAG high-power solid pulsed laser or a carbon dioxide laser. The metal powder spray head is used for spraying metal powder in a point-by-point and line-by-line manner to construct the metal wires. The workbench is used for plane scanning motion. The specific method is to fix the laser head on a cantilever of the workbench, so that the laser head performs the plane motion together with the workbench, and realizes point-by-point and line-by-line laser cladding until a cladding section is obtained.

S3: fix a first component to the first packaging substrate, and electrically connect the first component to the first packaging substrate.

The first component refers to the component that needs to be fixed to the first packaging substrate, and may be one or more components. The component includes passive components such as resistors, capacitors, inductors, and the like, as well as active components such as diodes, amplifiers and other functional chips, etc. In one embodiment, the component further includes an ASIC chip, a FPGA chip, a MEMS chip, a Flash chip, or a PowerPC processor chip or other microcircuit structures or systems.

The first component is fixed at a specific position on the first packaging substrate by gluing or soldering. When the first component is a stress-sensitive chip, such as the MEMS chip, the first component is preferably fixed by glue, and further the glue uses epoxy glue with smaller Young's modulus. When the first component is a chip with more signal pins, such as the IC chip, the first component is usually fixed by soldering. Further, a flip-chip bonding method is selected to directly implement the electrical connection between the first component and the first packaging substrate, and the complicated wire bonding process is avoided when too many pins are provided.

In one embodiment, after the first component is fixed to the first packaging substrate, the electrical connection between the first component and the first packaging substrate is achieved by wire bonding. Preferably, the wire bonding is accomplished by gold wire bonding. The parasitic parameters caused by the gold wire bonding are fewer, and the reliability is higher.

In one embodiment, a 3D printer directly prints an adhesive layer on the first packaging substrate. The role of the adhesive layer is to fix the first component to ensure that the first component will not move in the subsequent process, and the adhesive layer and the first packaging substrate also have a strong binding force. Specifically, the adhesive layer is selected from low stress glue such as UV adhesive glue and epoxy glue and the like. In other embodiments, other suitable adhesive materials may also be used for the adhesive layer, and the protection scope of the present invention should not be overly limited herein.

S4: continue to print a second packaging substrate on the surface of the first packaging substrate by using the 3D printing method, wherein metal wires are disposed on the second packaging substrate, and the second packaging substrate has an electrical connection with the first packaging substrate.

The drawing of the second packaging substrate may be manually inputted or may be automatically generated by scanning the second component.

The second packaging substrate is formed on the surface of the first packaging substrate, and is printed in the same way as the first packaging substrate. The thickness of the second packaging substrate is greater than the thickness of the first component, so that the upper surface of the second packaging substrate is still plane. In one embodiment, when the adhesive layer is formed on the surface of the first packaging substrate, the second packaging substrate is formed on the adhesive layer.

The material of the second packaging substrate is the plastic, ceramic, glass, metal or the like. Preferably, in order to reduce the thermal stress between different substrates, the material of the second packaging substrate is the same as that of the first packaging substrate.

S5: fix a second component to the second packaging substrate, and electrically connect the second component to the second packaging substrate.

The execution method of step S5 is the same as that of step S3.

S6: repeat step S2 to step S5 to form a multilayer system-level packaging structure in which all components are embedded.

The components are embedded in the multilayer system-level packaging structure, the layers of packaging substrates are electrically connected by vertical via, and the vertical via is formed at the same time when the layers of packaging substrates are formed. The material of the multilayer system-level packaging structure is the same.

In one embodiment, the chip is sensitive to variation of the outside temperature, and in order to reduce the influence of external temperature changes on the packaged chip, a hollow thermal insulation structure is further arranged in the multilayer packaging structure. That is, some of the packaging substrates are porous structures. The multilayer packaging structure with the hollow thermal insulation structure is especially suitable for high temperature environments.

In other embodiments, the chip itself generates more heat, and in order to improve the thermal dissipation of the chip itself at this time, the multilayer packaging structure also has a porous thermal dissipation structure or a local heat sink. That is, the porous thermal dissipation structure or the local heat sink is added to the upper surface or the lower surface of the chip or functional module with higher thermal dissipation requirements, which facilitates rapid thermal dissipation of the chip or the functional module, and is conducive to prolonging the life of the chip.

S7: print a packaging cover plate by using the 3D printing method.

In one embodiment, the packaging cover plate is formed on the surface of the topmost packaging substrate and completely covers the topmost packaging substrate. In other embodiments, the packaging cover plate is formed on the surface of the topmost packaging substrate, the surface of the carrier and the side surface of the multilayer packaging substrate, and the multilayer packaging substrate is completely packaged in a cavity formed by the packaging cover plate and the carrier.

The packaging cover plate is made of one of plastic, ceramic, glass and metal, and the plastic is—a polymer consisting at least one of an epoxy resin, a moldable plastic, a rubber, a polyimide or the like. In one embodiment, for the requirements of airtightness and environmental adaptability of the packaged chip, the packaging cover plate is made of a plastic material. The plastic cover plate is formed by ejecting a molten plastic sealing layer material according to a preset path by using the spray head. In another embodiment, the material of the packaging cover plate is ceramic or glass, and the packaging cover plate material can be ejected out in a powder state, and the material of the packaging cover plate in the powder state is adhered by using glue (for example, acrylic UV glue). The glue is also ejected out by the spray head.

After the packaging cover plate is formed, optionally, the method further includes the following steps:

S8: press the whole multilayer packaging structure.

The pressing method is an isostatic pressing method, and the pressing force is set correspondingly according to different materials of the packaging structure. In one embodiment, the isostatic pressing is performed at a certain temperature for a certain time, so that the entire packaging structure is more stable.

S9: remove the carrier.

For some packaging systems with volume or quality requirements, after steps S1-S8 are completed, the carrier needs to be removed to form the final package.

In one embodiment, after the carrier is removed, there is a further step of forming an electrical connection with the outside of the final package, such as a bonding pad or a pin.

The 3D printing technology in the present invention adopts computer digital control to generate a three-dimensional entity by adding and solidifying the added materials layer by layer.

The chip packaging method of the present invention adopts the 3D printing method to replace the photolithography and etching steps of through via, and to replace the photolithography, etching and electroplating deposition and other process steps of the metal wires, thereby greatly reducing process complexity and pollution emissions, significantly reducing the processing cost, effectively improving the processing efficiency, and being able to reduce the design and processing costs, shorten the research and development time and improve the processing accuracy and reliability. In addition, in the chip packaging method of the present invention, after the carrier and the packaging layer are removed, no redundant packaging layer is left on the back of the chip, so that the packaged chip is thinner and lighter, and the requirements of device miniaturization are satisfied.

As the present application adopts the system-level packaging method based on 3D printing, the substrate and the packaging cover plate with complex three-dimensional structures can be manufactured to adapt to the development of three-dimensional packaging.

The present application system-level packaging method based on 3D printing has prominent advantages in single-piece and small-batch production. Moreover, compared with the expensive high-precision equipment in the traditional packaging manufacturing technology, the industrial-grade 3D printer is low in cost, short in improvement period and high in production efficiency, and is particularly applicable to chip packaging experiments in the research and development stage.

Therefore, the system-level packaging method based on 3D printing of the present invention has high packaging accuracy, high production efficiency, and better packaging performance.

The present invention further provides a packaging system based on 3D printing, wherein the packaging system includes:

A pick-and-place unit used for picking and placing a component. Specifically, the pick-and-place unit is used for placing the component on a corresponding position of the packaging substrate, and further, the pick-and-place unit can also provide a certain pressure for the component in the SMD step to ensure better SMD quality.

An input unit used for inputting a design drawing. The input unit is used for receiving the design drawing and outputting the same to a printing unit, and the design drawing can be manually inputted and can also be automatically generated by the scanning of a scanning unit.

The printing unit used for printing a packaging substrate and a packaging cover plate. The printing unit can also print metal wires on the packaging substrate. In one embodiment, the printing unit can also print an adhesive layer. In one embodiment, the printing unit is composed of an industrial-grade 3D printer.

A SMD unit used for fixing the component to the packaging substrate. The SMD unit can fix the component to the corresponding packaging substrate by adhering or soldering. In one embodiment, the SMD unit is composed of a SMD machine.

A bonding unit used for accomplishing the electrical connection between the packaging substrate and the corresponding component. In one embodiment, the bonding unit accomplishes the electrical connection between the substrate and the corresponding component through wire bonding. In other embodiments, the electrical connection between the substrate and the corresponding component may also be accomplished through other methods such as flip-chip bonding. In one embodiment, the bonding unit is composed of a wire bonder.

In one embodiment, the packaging system based on 3D printing further includes a scanning unit used for scanning the component to generate the design drawing of the corresponding packaging substrate layer.

In one embodiment, the packaging system further includes an alignment unit used for accurately picking and placing the device and placing the same on a corresponding position of the packaging substrate. Preferably, the alignment unit adopts laser alignment and the alignment accuracy is higher than 10 um.

The technical features of the above embodiments may be combined arbitrarily. To make the description succinct, all the possible combinations of the technical features in the above embodiments are not described. However, as long as there is no contradiction in the combination of these technical features, all should be considered as falling within the scope recorded in the specification.

The above embodiments merely represent several embodiments of the present invention, and are described in a more specific and detailed manner, but they should not be understood as limit to the patent scope of the present invention. It should be noted that, for those of ordinary skill in the art, various variations and improvements that may be made without departing from the concept of the present invention are all within the protection scope of the present invention. Therefore, the protection scope of the present invention shall be subject to the appended claims.

The invention claimed is:

1. A system-level packaging method based on 3D printing method, comprising the following steps:
    S1, providing a carrier which is ceramic, and wherein a roughness of an upper surface of the carrier is less than 50 micrometers;
    S2, printing a first packaging substrate which is aluminum nitride on the surface of the carrier by using the 3D printing method, wherein metal wires are disposed on the first packaging substrate;
    wherein a preparation method of the metal wires includes the following steps: spraying metal powder on a surface of the substrate according to a preset path by using a spray head, and synchronously melt the metal powder;
    S3, fixing a first component to the first packaging substrate, and electrically connecting the first component to the first packaging substrate, wherein the first component is fixed by a flip-chip bonding method;
    wherein a surface of the packaging substrate is provided with a groove matching with a corresponding component, and the corresponding component is embedded in the groove;
    S4, printing an adhesive layer on the first packaging substrate;
    S5, continuing to print a second packaging substrate on the surface of the first packaging substrate by using the 3D printing method, wherein metal wires are disposed on the second packaging substrate, and the second packaging substrate has an electrical connection with the first packaging substrate;
    S6, fixing a second component to the second packaging substrate, and electrically connecting the second component to the second packaging substrate;
    S7, repeating steps S2-S6 to form a multilayer system-level packaging structure;
    wherein layers of the packaging substrates are electrically connected by a vertical via, and the vertical via is formed at the same time when the layers of the packaging substrates are formed;
    S8, printing a packaging cover plate on the surface of the topmost packaging substrate by using the 3D printing method;
    S9, pressing the multilayer system-level packaging structure by using an isostatic pressing method;
    S10, removing the carrier to form a final packaging structure; and
    S11, forming an electrical connection pathway with the outside of the final packaging structure.

2. The system-level packaging method based on 3D printing method of claim 1, wherein before printing each layer of the packaging substrate, the method further comprises the following steps:
    scanning the to-be-packaged component corresponding to the present packaging substrate layer; and
    generating a 3D printing design drawing corresponding to the present packaging substrate layer.

3. The system-level packaging method based on 3D printing method of claim 1, wherein materials of the packaging substrate and the packaging cover plate comprise at least one of plastic, ceramic, glass and metal.

4. The system-level packaging method based on 3D printing method of claim 1, wherein the packaging method can be applied to package an ASIC chip, a FPGA chip, a MEMS chip, a Flash chip or a PowerPC processor chip, or a functional module or system consisting of the above chips.

* * * * *